United States Patent [19]

Torenius et al.

[11] 4,349,858
[45] Sep. 14, 1982

[54] CONTROL CIRCUIT FOR USE WITH AN ELECTRONIC GUARD STRIP

[75] Inventors: Pekka Torenius, Korpi; Seppo Suur-Askola, Hyvinkää, both of Finland

[73] Assignee: Elevator GmbH, Baar, Switzerland

[21] Appl. No.: 184,072

[22] Filed: Sep. 4, 1980

[51] Int. Cl.³ ............................................. G08B 13/26
[52] U.S. Cl. ...................... 361/181; 361/203
[58] Field of Search ............... 361/181, 203; 307/116, 307/308; 331/65; 340/562, 563, 564; 328/5

[56] References Cited

U.S. PATENT DOCUMENTS 3,496,381 2/1970 Wisnia ............................ 340/562 X
4,168,495 9/1979 Sweeney ............................ 331/65 X

FOREIGN PATENT DOCUMENTS 2626936 12/1977 Fed. Rep. of Germany ...... 340/562

Primary Examiner—Harry E. Moose, Jr.
Attorney, Agent, or Firm—Martin Smolowitz

[57] ABSTRACT

A control circuit for use with an electronic guard strip for preventing collision of the strip with a moving object. A control such as a relay, is connected to at least one antenna, which antenna forms a capacitor together with a base in its ambiance. A voltage generator conducts an alternating voltage to the antenna. The control and the antenna are connected in circuit relation to an amplifier. A change of voltage arising from any capacitive protuberation in the antenna is conducted to the control. The voltage from the amplifier is conducted through a rectifier to another amplifier that is connected so as to have its direct current gain as +1, but which amplifies any change of voltage occurring in the d.c. voltage input to a multiple and which further acts upon the control through a comparator.

4 Claims, 3 Drawing Figures

CONTROL CIRCUIT FOR USE WITH AN ELECTRONIC GUARD STRIP

BACKGROUND OF INVENTION

The present invention is directed to a control circuit for use with an electronic guard strip for prevention of collision with a moving object, controlling a control means such as a relay, and comprises at least one antenna which together with a base in its ambience constitutes a capacitor, and a voltage source such as a generator, from which an alternating voltage has been conducted to the antenna, and an amplifier, with which the control means and antenna have been so connected that the change of voltage resulting from a capacitive disturbance in the antenna has been conducted to the control means. A moving object is understood to be for instance: the automatic doors of a lift, controllable platforms for installation work, or moving and transporting apparatus.

DESCRIPTION OF THE PRIOR ART

It is common practice for instance in connection with automatic doors to install protective devices to prevent persons using the doors from being caught in the doors, and also to prevent the doors from colliding with people. Similarly, such protective means may be built to serve other purposes, such as the prevention of collisions between controllable platforms for installation work or moving and transporting apparatus or their collision with other obstacles. Devices used to this end include: mechanical sensor strips, photocells, ultrasonic equipment, and sensors based on capacitive measurement. Among the kinds of apparatus mentioned, those operating according to a capacitive principle are the most favourable. Among their advantages is its: attractive architectural appearance, because all components may be concealed. Another advantage of capacitive sensors is their good reliability owing to the fact that the apparatus can be made operative without any mechanical parts which would move and be subject to wear. Capacitive sensors of this type are known in the art e.g. through the following references: U.S. Pat. No. 3,370,677; U.S. Pat. No. 3,743,058; British Pat. No. 1,108,884; and Finnish publicizing print No. 53234.

The weak point of the apparatus according to the U.S. Pat. No. 3,370,677 are the problems incurred through the changing of the apparatus characteristics. This is evident, for instance, in that the ground capacitances arising from lift doors are different on each floor owing to mechanical tolerances. It is then impossible to set the sensitivity of the apparatus very high because a false door control signal could be obtained. Also capacitance conditions are altered, and the sensitivity is restricted, also by humidity/moisture and by dents inflicted on the antennas mounted on the door edges. Another weak point of the apparatus is its sensitivity to the capacitance between the guard plate and the sensor plate. This capacitance should be minimized, compared with the capacitance against ground that is being measured, in order that the measured signal might be adequate. The low capacitance requirement implies a mechanically expensive, and therefore unfavourable, antenna design.

The objectionable feature of the capacitive sensor disclosed by the U.S. Pat. No. 3,743,058, mentioned second, is that the tuning takes place at the beginning of the opening movement of the door. In that case, any perturbation in the capacitive conditions occurring after the beginning of the opening movement in the antennas disposed in the door edge, will derange the operation of the control means and thereby of the doors.

The sensor of the British Pat. No. 1,108,884 presents the same drawbacks, mentioned above. In other words, the apparatus is sensitive to disturbances arising from changes and from the capacitance conditions in the mechanical equipment itself. Moreover, a weak point of the British apparatus is the potential difference between the screening voltage and the measuring antenna. Although it is possible by means of the screening voltage to prevent the effect of objectionable ground capacitances, the capacitance of the parts carrying screening voltage must not be large with reference to the measuring antennas because this capacitance attenuates the measuring signal that is obtained. As a consequence the use of coaxial leads with screening voltage for measurement signal transfer from the antenna to the amplifier is limited. In order to increase the sensitivity, the amplifier frequently has to be installed at a mechanically awkward point, such as immediately adjacent to the sensor strip, affixed to the moving door. If two separate door halves are used, two separate sets of amplifying apparatus are required.

In the apparatus of the Finnish publicizing print No. 53294, part of these drawbacks have been eliminated. In this apparatus, the circuit of the tuning unit is such that the set/hold circuit becomes tuned at the beginning of the closing movement of the door, whereby only the differential voltage due to any capacitive perturbation changing in its magnitude during the closing movement passes through the set/hold circuit and amplifier to the control means. In the apparatus, the doors cannot be fully closed without special override switching by which the measuring of capacitance is terminated. The weak point is exactly this switch, which renders the apparatus more prone to faults and more expensive.

SUMMARY OF INVENTION

The object of the present invention is to eliminate the drawbacks mentioned and to provide a simple and reliably operating guard strip of a new type.

The guard strip of the invention is characterized in that the voltage from the amplifier is conducted through a rectifier (11) to an amplifier (5) so connected that its d.c. gain is +1, but which amplifies to a multiple any change of voltage in the incoming d.c. voltage, and which further through a comparator (6), controls the control means (7). By the aid of the invention, the variation of capacitance can be continuously measured within a very wide span, whereby obstacles of greatly different sizes can act upon the apparatus when entering the field of observation with a velocity exceeding the velocity that has been set. When an obstacle enters the field of observation of the apparatus, a capacitance measured by the apparatus increases and the voltage rise, proportional to the increase of capacitance, passes through the amplifier to the control means.

One possible application consists of the automatic doors of a lift, where the antennas mounted on the edges of opposed doors are mutually at the same potential. This enables the doors to run to their fully closed position without any separate override circuit, because as the doors approach each other the measured capacitance decreases since the influence of the opposite door increases.

Another application are controllable platforms for installation work and moving and transporting apparatus, where antennas have been mounted on the edge of the equipment. When the apparatus approaches any object, the capacitance between the antenna and this object will increase, and the control means reacts to avoid a collision.

BRIEF DESCRIPTION OF THE DRAWINGS

The invention is described in the following in detail with the aid of an example, with reference to the attached drawings.

DETAILED DESCRIPTION OF PREFERRED EMBODIMENT

Figure 1:
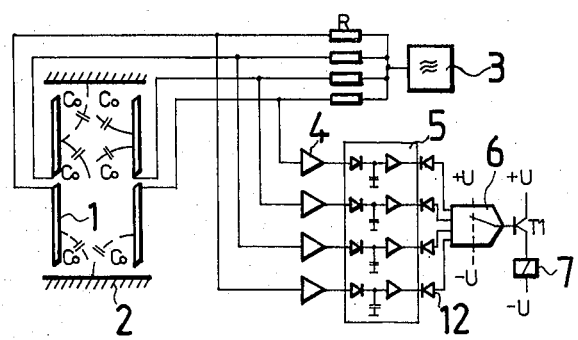
FIG. 1 displays the overall placement of the guard strip, connected to the automatic doors of a lift.
Figure 2:
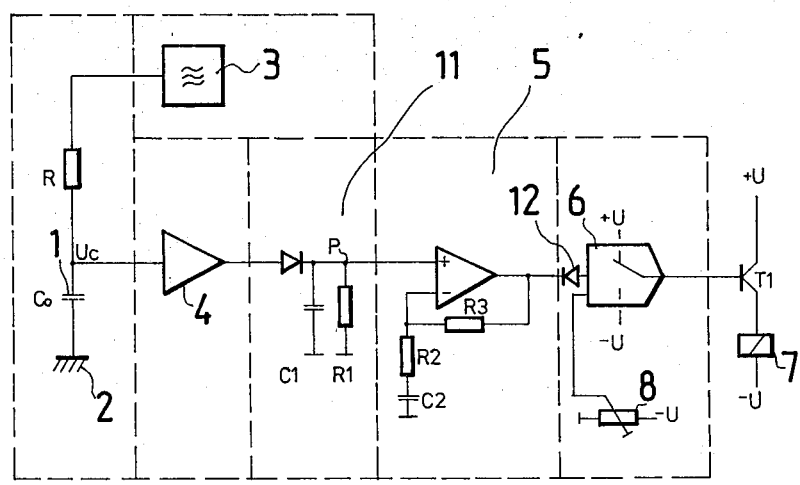
FIG. 2 presents, in terms of commonly understood components, the electrical embodiment of one operational block of the guard strip of FIG. 1.

The operation of the guard strip is based on measurement of the capacitance between an antenna 11, disposed in the end face of the cage door, and its ambience 2. FIG. 2 illustrates the measuring principle. The capacitance to be measured is Co. When Co is connected by means of the resistor R to the alternating voltage produced by the generator 3, a voltage Uc is established across Co, having a value proportional to the magnitude of Co. Because of the high impedance levels of R and Co, the voltage to be measured, Uc, has to be connected to the measuring circuit with the aid of an amplifier 4. After the amplifier 4, the voltage is rectified and filtered to be available at the point P.

The amplifier 5 measures the voltage at P. If the voltage is constant (Co=constant), the amplifier 5 will operate in likeness with the amplifier 4. Its output voltage will be the same as the voltage at P. In that case the output voltage of the comparator 6 is positive and the relay 7 is deenergized. When the door edge approaches a person, or an object, the value of Co will increase, whereby the voltages Uc and P are reduced. The amplifier 5 amplifies the change of voltage at P to a multiple. Since the absolute value of the voltage P was reduced, the output voltage of amplifier 5 will become more negative. The change in the negative direction will be greater for greater change of voltage at P. If the output voltage of amplifier 5 falls short of the action threshold of the comparator 6, the comparator output voltage will change to be negative. The transistor T is supplied with base current, and the relay 7 will attract its armature.

Since the amplifier 5 has been connected to operate as an a.c. amplifier, its output voltage will begin to rise towards positive immediately after the value of Co no longer increases. When the output voltage of amplifier 5 surpasses the action threshold of the comparator 6, the relay 7 will drop its armature. In other words, the relay 7 may attract is armature only if the value of Co increases, and it remains energized a brief instant only if the value of Co remains constant and returns to be as before. The sensitivity of operation of the measuring circuit is controlled by the trimmer 8, which determines the action threshold of the comparator.

In actual practice, the end faces of the doors are covered with an electrically conductive material 9. With a view to improving the measuring sensitivity, the end face of one door half has been divided into two sections of equal size. One pole of the capacitance Co consists of the electrically conductive surface 1; the other pole is Ground 2. Each section's capacity is measured on a channel of its own. The channels are independently controlled, with the aid of the comparator 6, the relay 7.

In the door-closing phase, the value of Co is strongly reduced, because the area between antenna 1 and ground 2 becomes less and the influence of the opposite door surface at the same potential increases. Since nothing but an increase of the value of Co can cause the relay 7 to attract its armature, the doors may close, in spite of the approach of the opposite door leaf.

Figure 3:
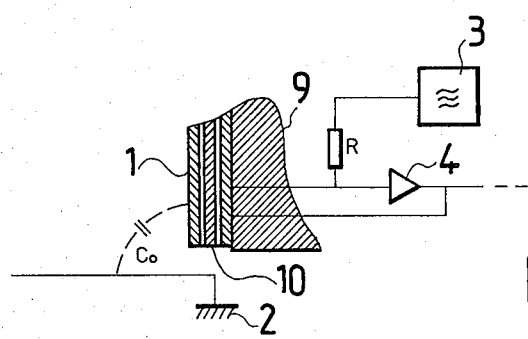
FIG. 3 shows the cross section of a guard strip of the invention, affixed to the automatic doors of a lift.

Substantial improvement of the measuring sensitivity is achieved if the antenna section 1 is constructed and connected as shown in FIG. 3. The antenna plate 1,9 consists of two electrically conductive surfaces with an insulation 10 between them. When the output voltage of the amplifier 4 is connected to the electrically conductive surface 9, the capacitance arising from the door leaf will not be connected in parallel with Co because the voltage of the surface 9 is always at the same potential as the surface 1. Hence it follows that the value of Co is small, and even a minor perturbation (= change of capacitance) will cause a major change in the value at rest of Co.

A diode 12 is between the amplifier 5 and the comparator 6, separately in each channel, in order to render possible the parallel operation of a plurality of antennas. It is advantageous, owing to practical reasons, to connect several antennas in parallel, because the sensitivity of measurement may be improved even further.

We claim:

1. An improved control circuit for use with an electronic guard strip to prevent collision of the strip with a moving object, said control circuit having a control means and comprising at least one antenna forming a capacitor together with a base in its ambiance, a voltage generator for conducting an alternating voltage to said antenna, a first amplifier means in circuit relation with said control means and said antenna, whereby a change of voltage arising from any capacitive perturbation in said antenna is conducted to said control means, the improvement comprising: rectifier means and a second amplifier means, said rectifier means connected to said amplifier means and to said second amplifier means in sequence, said second amplifier means acting as an a.c. amplifier, having its direct current gain as +1, but which amplifies any change of voltage occurring in the d.c. voltage input to a multiple, comparator means, said control means being connected to said comparator means through said amplifier means, and said control means being responsive to an action threshold value of said comparator means in respect of output voltage of said second amplifier means.

2. An improved control circuit as claimed in claim 1, further including: a trimmer potentiometer in circuit relationship with said comparator means for adjustment of measuring circuit sensitivity by varying the threshold level of said comparator means.

3. An improved control circuit for use with an electronic guard strip with a moving object, said control circuit having a control means and comprising: multiple antennae forming a capacitor together with a base in its ambiance, a voltage generator multiply connected to said antennae for conducting alternating voltages respectively to said antennae; multiple first amplifier means in circuit relation with said control means and said antennae, whereby a change of voltage arising from any capacitive perturbation in said antennae is conducted to said control means, the improvement comprising: multiple rectifier means and multiple second amplifier means, said multiple rectifier means connected to said multiple first amplifier means and to said multiple second amplifier means in sequence, said multiple second amplifier means acting as an a.c. amplifier, having its direct current gain as +1, but which amplifies any change of voltage occurring in the d.c. voltage inputs to a multiple comparator means, said control means being connected to said multiple comparator means through said multiple second amplifier means, and said control means being responsive to an action threshold value of said multiple comparator means in respect of output voltage of said multiple amplifier means.

4. An improved control circuit as claimed in claim 3, further including: diodes connected between said multiple second amplifier means and said multiple comparator means to enhance measurement sensitivity when a plurality of antennae are connected in parallel.

* * * * *